(12) United States Patent  
Chin et al.

(10) Patent No.: US 9,414,516 B2
(45) Date of Patent: Aug. 9, 2016

(54) DIGITAL SIGN AND METHOD OF DRIVING THE SAME

(71) Applicant: LG ELECTRONICS INC., Seoul (KR)

(72) Inventors: Injae Chin, Seoul (KR); Sungwook Han, Seoul (KR); Jiyong Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 147 days.

(21) Appl. No.: 14/250,995

(22) Filed: Apr. 11, 2014

(65) Prior Publication Data

US 2015/0009625 A1  Jan. 8, 2015

(30) Foreign Application Priority Data

Jul. 8, 2013 (KR) .................. 10-2013-0079446

(51) Int. Cl.
*H05K 7/20* (2006.01)
*G02F 1/1333* (2006.01)
*G09F 9/30* (2006.01)

(52) U.S. Cl.
CPC ...... *H05K 7/20145* (2013.01); *G02F 1/133382* (2013.01); *G02F 1/133385* (2013.01); *H05K 7/20209* (2013.01); *G09F 9/30* (2013.01)

(58) Field of Classification Search
None
See application file for complete search history.

(56) References Cited

U.S. PATENT DOCUMENTS

| 7,995,342 B2* | 8/2011 | Nakamichi ....... G02F 1/133308 361/695 |
| 8,379,384 B2* | 2/2013 | Smalen ............. H05K 7/20909 165/104.33 |
| 8,693,185 B2* | 4/2014 | Dunn ................ G02F 1/133385 165/80.3 |

(Continued)

FOREIGN PATENT DOCUMENTS

| KR | 10-2003-0010869 A | 2/2003 |
| KR | 10-2009-0088239 A | 8/2009 |

(Continued)

OTHER PUBLICATIONS

International Search Report and Written Opinion dated Jul. 30, 2014 issued in Application No. PCT/KR2014/003099.

*Primary Examiner* — Courtney Smith
(74) *Attorney, Agent, or Firm* — KED & Associates, LLP

(57) ABSTRACT

A digital sign and a method of driving a digital sign are provided. The digital sign may include a case, a display panel provided in the case, and a circuit unit to drive the display panel. An inner space of the case may include a first space and a second space, with a first end of the first space connected to a first end of the second space. A suction port may be formed in the case to guide external air into the inner space, and a discharge port may be formed in the case to discharge the air from the case. A circulation fan may be provided in the inner space to induce flow of air in the inner space, and a circulation damper may be disposed between second ends of the first space and the second space to open and close the second ends thereof. The air introduced through the suction port passes through the inner space of the case and is discharged through the discharge port when the circulation damper is closed, and the air circulates in the first space and the second space when the circulation damper is opened.

19 Claims, 14 Drawing Sheets

(56) References Cited

U.S. PATENT DOCUMENTS

| | | | | |
|---|---|---|---|---|
| 2009/0310059 A1* | 12/2009 | Kim | .................. | G02F 1/133385 349/58 |
| 2010/0321887 A1* | 12/2010 | Kwon | ................ | H05K 7/20972 361/695 |
| 2011/0085302 A1* | 4/2011 | Nakamichi | ........ | H05K 7/20972 361/695 |
| 2011/0162831 A1* | 7/2011 | Lee | .................... | H05K 7/20972 165/287 |
| 2011/0167845 A1* | 7/2011 | Lee | .................... | H05K 7/20972 62/89 |
| 2012/0255721 A1* | 10/2012 | Kim | .................. | G02F 1/133382 165/288 |
| 2014/0098493 A1* | 4/2014 | Chen | .................. | H05K 7/20127 361/692 |
| 2014/0313666 A1* | 10/2014 | Chin | .................. | H05K 7/20972 361/692 |
| 2014/0334100 A1* | 11/2014 | Yoon | .................. | H05K 7/20145 361/692 |
| 2015/0009625 A1* | 1/2015 | Chin | .................. | H05K 7/20145 361/695 |

FOREIGN PATENT DOCUMENTS

| | | |
|---|---|---|
| KR | 10-1016222 B1 | 2/2011 |
| KR | 10-2013-0053157 A | 5/2013 |

* cited by examiner

DIGITAL SIGN AND METHOD OF DRIVING THE SAME

CROSS-REFERENCE TO RELATED APPLICATION(S)

This application claims priority under 35 U.S.C. §119 to Korean Application No. 10-2013-0079446 filed in Korea on Jul. 8, 2013, whose entire disclosure is hereby incorporated by reference.

BACKGROUND

1. Field

This relates to digital sign which is stably operable in a low temperature environment and a method of driving the same 2. Background Digital sign may provide varied content and messages via a display panel rather than typical hardware media, such as a signboard or a poster, for outdoor advertisement, making use of intelligent digital video devices based on LCDs LEDs. As the size of the display panel increases, the amount of heat generated by the display panel associated drive circuit boards also increase. Efficient dissipation of heat generated by the display panel and the circuit boards may allow the digital sign to operate normally, even in a hot and humid outdoor environment. In addition, since the temperature of such an outdoor environment may vary seasonally, digital sign may employ a fan and a heater to remain within a range of acceptable operating temperatures, significantly increasing energy consumption.

BRIEF DESCRIPTION OF THE DRAWINGS

The embodiments will be described in detail with reference to the following drawings in which like reference numerals refer to like elements wherein.

DETAILED DESCRIPTION

In the following detailed description, reference is made to the accompanying drawing figures which form a part hereof, and which show by way of illustration various embodiments as broadly described herein. It is to be understood by those of ordinary skill in this technological field that other embodiments may be utilized, and structural, electrical, as well as procedural changes may be made without departing from the scope as broadly described herein. Wherever possible, the same reference numbers will be used throughout the drawings to refer to the same or similar parts.

As used herein, the suffixes 'module', 'unit' and 'part' may be used for elements in order to facilitate the disclosure only. Therefore, significant meanings or roles are not given to the suffixes themselves and it is understood that the 'module', 'unit' and 'part' may be used together or interchangeably.

Figure 1:
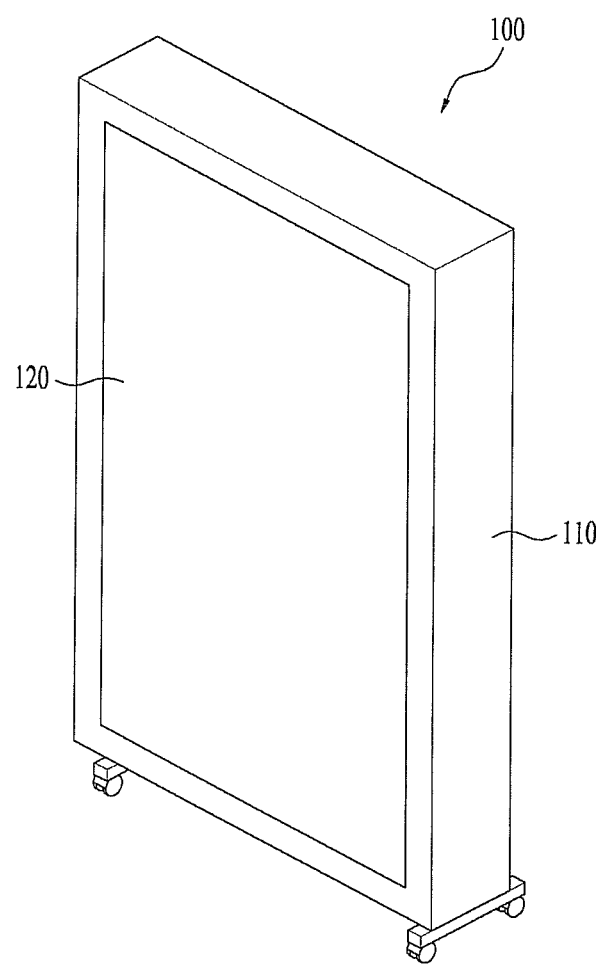
FIG. 1 is a front perspective view of digital sign according to one embodiment as broadly described herein.
Figure 2:
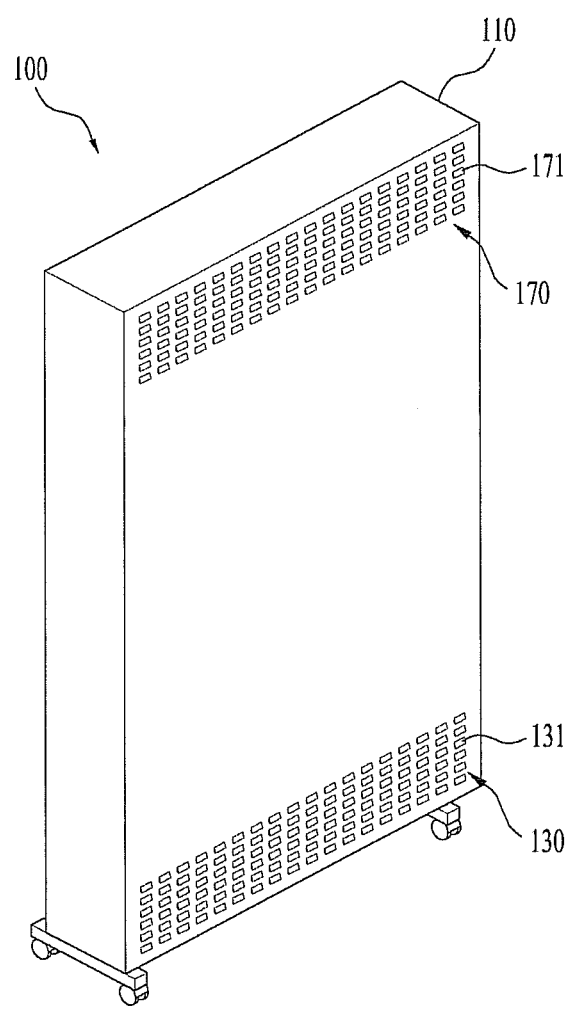
FIG. 2 is a rear perspective view of the digital sign shown in FIG. 1, according to one embodiment as broadly described herein.

As shown in FIGS. 1 and 2, a digital sign 100, or sign, according to one embodiment as broadly described herein may include a case 110 provided with a display panel 120 disposed on the front surface thereof and an inner space in which various components are arranged. In the case 110, various electronic components including the display panel 120 and a circuit unit 125, or circuit device 125, generates heat during operation.

The display panel 120 may include at least one of a liquid crystal display (LCD), a thin film transistor-liquid crystal display (TFT LCD), an organic light-emitting diode (OLED), a flexible display, or a 3D display.

As luminance of the display panel 120 increases to secure visibility even in a bright environment and the size thereof increases, the amount of heat generated therein also increases. Heat generated by the display panel 120 and the circuit unit 125 may cause the display panel 120 to overheat and degrade image quality.

The circuit unit 125 (see FIG. 3) may include various circuit elements to control the screen of the display panel 120. The circuit unit 125 applies a voltage signal for implementation of an image and supplies power. The circuit unit 125 is electrically connected to the display panel 120 to deliver a driving signal. To implement electrical connection between the circuit unit 125 and the display panel 120, a flexible device such as a cable or a flexible printed circuit may be used.

To efficiently discharge heat generated by the display panel 120 or the circuit unit 125 from the case 110, a cooling structure to cause air to pass through the case 110 to carry away heat may be provided. The air may be introduced through a suction port 130 and discharged through a discharge port 170.

The suction port 130 may be located at, for example, a lower portion of the case 110. If the suction port 130 is excessively large, unwanted elements, such as birds or rats or debris, may enter the case 110 through the suction port 130. Accordingly, a plurality of small openings may form the suction port 130 as shown in FIG. 2. A louver 131 may protrude outward at an upper portion of each of the openings 130 to prevent rain from flowing down into the case 110.

While the discharge port 170 is illustrated as being formed at an upper portion of the rear surface of the case 110, embodiments are not limited thereto. The discharge port 170 may be formed on an upper surface or lateral surface of the case 110. The discharge port 170 may guide the air having absorbed heat generated in the digital sign 100 out of the case 110 to be discharged. Accordingly, the discharge port 170 may be disposed at the upper portion of the case 110 in consideration that heat moves upward. The discharge port 170 may include a plurality of openings, and each may also include a louver 171 to prevent introduction of rain therethrough, as in the suction port 130.

Figure 3A:
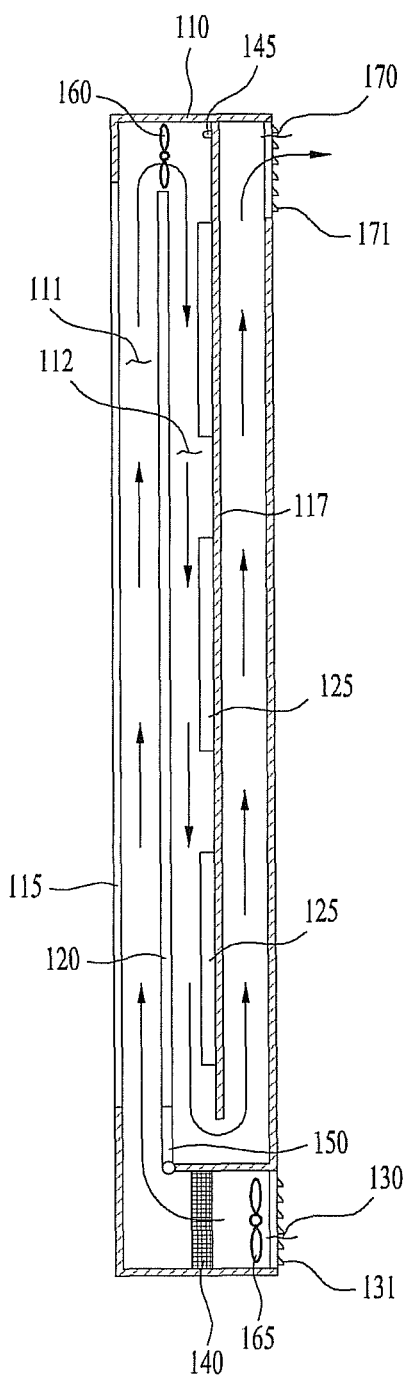
FIGS. 3A and 3B are lateral cross-sectional views of digital sign, according to a first embodiment as broadly described herein.
Figure 3B:
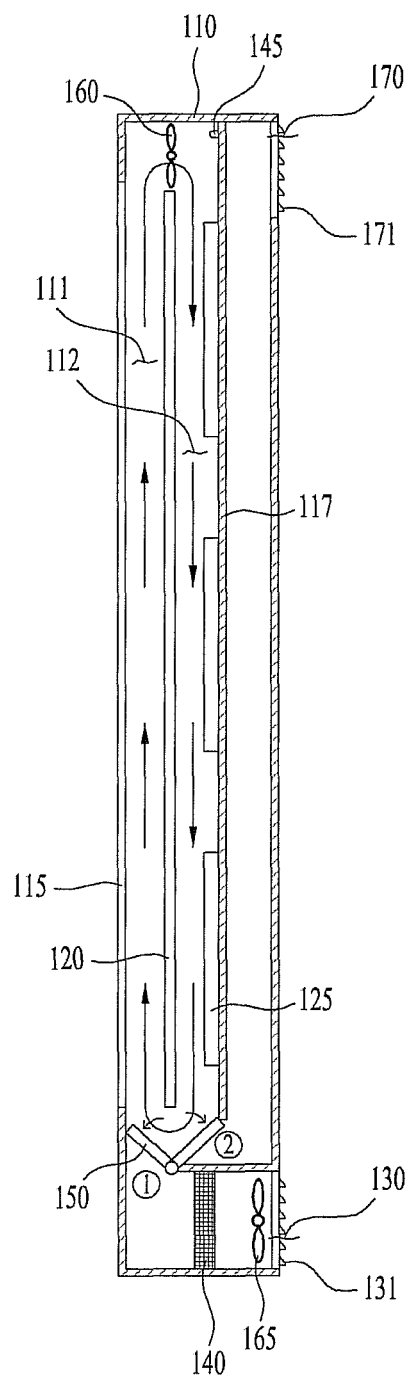

FIGS. 3A and 3B are lateral cross-sectional views of digital sign 100 according to a first embodiment, including a case 110, a display panel 120, a circuit unit 125, a filter 140, a temperature sensor 145 a circulation damper 150, a circulation fan 160, and a suction fan 165. FIG. 3A illustrates the digital sign 100 driven in a high-temperature environment, and FIG. 3B illustrate the digital sign 100 driven in a low-temperature environment.

The case 110 is provided therein with a first space 111 and a second space 112. A first end of the first space 111 is connected to a first end of the second space 112, and a second end of the first space 111 and a second end of the second space 112 are opened and closed by the circulation damper 150. The circulation damper 150 may open and close the access between the second ends of the first space 111 and the second space 112, and may be driven by a motor. The temperature sensor 145 may generate a control signal for driving the motor according to a measured temperature, thereby opening and the circulation damper 150.

In this embodiment, the first space 111 is a space defined between the display panel 120 and a glass panel 115 disposed in front of the display panel 120. The second space 112 is formed at the back of the display panel 120, and the circuit unit 125 is arranged in the second space 112. The first space 111 and the second space 112 are divided by the display panel 120. As shown in FIGS. 3A and 3B, the space above the upper end of the display panel 120 is open, and the space below the lower end of the display panel 120 is opened and closed by the circulation damper 150.

FIG. 3A illustrates driving of the digital sign 100 in a high-temperature environment, with the lower end portions of the first space 111 and the second space 112 closed according to closing of the circulation damper 150 and the upper end portions of the first space 111 and the second space 112 connected to each other.

A high-temperature environment may represent a temperature greater than or equal to a first reference temperature. In the high-temperature environment, the temperature of the circuit unit 125 and/or the display panel 120 in the digital sign 100 may increase beyond an temperature range at which operation may be allowable (from about 0° C. to about 50° C.). Accordingly, air may be introduced into the case 110 to lower the temperature to prevent the temperature from exceeding the allowable temperature range.

When the temperature measured by a temperature sensor 145 is greater than or equal to the first reference temperature, the circulation damper 150 closes the space between the second ends of the first space 111 and the second space 112, and a circulation loop circulating between the first space 111 and the second space 112 is interrupted. That is, rather than an open circulation loop having both ends of the first space 111 and the second space 112 opened, a loop having only one end of each of the first space 111 and the second space 112 opened to allow introduction of external air through the suction port 130 and discharge of the air through the discharge port 170 may be formed. The first reference temperature may be set an allowable operation temperature range of the circuit unit 125 and/or the display panel 120 (for example, 40° C.).

The first reference temperature may be a particular temperature or a temperature range having an upper limit and a lower limit. In the case that the measured temperature greater than or is equal to the upper limit of the first reference temperature, the circulation damper 150 is closed. In the case that the measured temperature is less than the first reference temperature, the circulation damper 150 is opened. That is, when the circulation damper 150 is closed and the measured temperature decreases below the lower limit of the first reference temperature, the circulation damper 150 may be opened. When the circulation damper 150 is opened and the measured temperature becomes greater than or equal to the upper limit of the first reference temperature, the circulation damper 150 may be closed.

To measure the temperature of the interior or exterior of the case 110, the temperature sensor 145 may be used. As the temperature sensor, a thermocouple, a resistance thermometer, a thermistor (NTC), a metal thermometer, a thermistor (NTC, PTC, and CTR), or a thomo-sensitive ferrite may be used.

In the case that the temperature sensor 145 compares a temperature with multiple reference temperatures, a precise temperature sensor 145 is needed. However, in the case that only one reference temperature is given, whether to drive the suction fan 165 may be determined upon opening or closing of the circulation damper 150. In the case that only one reference temperature is given as in continuous driving of the circulation fan 160, a temperature sensor 145 having a simple form may be used.

For example, in the case that a bimetal, which changes the shape thereof according to temperature, is used, the temperature sensor 145 may be configured to generate a signal to close the circulation damper 150 when the temperature is greater than or equal to the first reference temperature, and to generate a signal to close the circulation damper 150 when the temperature is less than the first reference temperature.

In the driving operation to discharge heat produced in the digital sign 100 in a high-temperature environment, the air introduced through the suction port 130 of the digital sign 100 may leave the discharge port 170 after passing through the second space 112 via the first space 111. The air absorbs heat from the display panel 120 in the first space 111, absorbs the heat from the display panel 120 and the circuit unit 125 in the second space 112, and then leaves through the discharge port 170.

To ensure smooth introduction of air, the suction fan 165 may be provided at the suction port 130. Since the suction fan 165 connects the suction port 130 to the first space 111 and the second space 112 in the case 110 only when the circulation damper 150 is closed, the suction fan 165 operates only when the circulation damper 150 is closed.

In the case that the circulation fan 160 is in operation or the temperature of the interior of the digital sign 100 is not too high, the suction fan 165 does not need to operate even if the circulation damper 150 is closed. That is, the suction fan 165 may be controlled to operate only when the temperature is greater than or equal to a second reference temperature. Herein, the second reference temperature may be greater than or equal to the first reference temperature. In the case that the second reference temperature is equal to the first reference temperature, the suction fan 165 may be driven according to opening and closing of the circulation damper 150. That is, the suction fan 165 operates when the circulation damper 150 is closed, and stops when the circulation damper 150 is opened.

The digital sign 100, which may also be installed in an indoor space, is usually installed in an outdoor space such that it is exposed to many people. When the digital sign 100 is installed in an outdoor space, the filter 140 may be arranged in the case 110 to filter out foreign substances such as dust and sand in the external air which is introduced into the case 110 to cool the interior of the case 110. Thereby, the foreign substances may be prevented from being introduced into the case 110 to degrade the durability of the digital sign 100.

The suction fan 165 is disposed at a position adjacent to the suction port 130 to cause introduction of external air. While the suction fan 165 is illustrated as being located at the outer side of the filter 140, the suction fan 165 may be disposed at the inner side of the filter 140 to prevent contamination by dust (see FIG. 7A).

The circulation fan 160 is located in the first space 111 or the second space 112 in the case 110 to assist circulation of air in the case 110. While the circulation fan 160 is illustrated as being arranged in space between the first end of the first space 111 and the first end of the second space 112, it may be arranged at the second end of the first space 111 or the second end of the second space 112.

The circulation fan 160 may continuously operate regardless of the temperature. However, in view of energy efficiency, the circulation fan 160 may be shut off when within the allowable operating temperature range of the display panel 120 and/or the circuit unit 125, and may be operated only when the internal temperature of the case 110 is high or the temperature difference is large.

The circulation fan 160 may be driven when the temperature is greater than or equal to a third reference temperature. The third reference temperature may be higher or less than the second reference temperature causing the suction fan 165 to be driven. Both the circulation fan 160 and the suction fan 165 are driven when the temperature is greater than or equal to the higher one of the second reference temperature and the third reference temperature, while only one of the circulation fan 160 and the suction fan 165 is driven when the temperature is between the second reference temperature and the third reference temperature.

Next, FIG. 3B is a cross-sectional view illustrating the position of the circulation damper 150 and the airflow during driving of the digital sign 100 shown in FIG. 3A in a low-temperature environment. The low-temperature environment refers to an environment in which the temperature is less than or equal to temperature range in which the display panel 120 or circuit unit 125 of the digital sign 100 is operable. The interior of the case 110 at a temperature less than or equal to the first reference temperature may be seen as the low-temperature environment.

In the low-temperature environment, the digital sign 100 cannot be properly driven. Accordingly, in some cases, a heater may be arranged in the case 110 to increase the internal temperature. However, in this embodiment, the internal temperature of the case 110 may be raised using the heat produced by the display panel 120 and/or the circuit unit 125 without assistance from a heater.

Referring to FIG. 3A, the circulation damper 150 closing the second ends of the first space 111 and the second space 112 is opened and moved to position ① or ②. At position ①, the circulation damper 150 closes the suction port 130, blocking introduction of external air into the first space 111 and the second space 112. At position ②, the circulation damper 150 closes the discharge port 170, blocking discharge of the air from the first space 111 and the second space 112.

That is, when the circulation damper 150 is opened, both ends of each of the first space 111 and the second space 112 are opened to form a circulation loop. In addition the circulation damper 150 shuts off one of the suction port 130 or the discharge port 170 to prevent introduction or discharge of air, and controls airflow such that air circulates internally. A portion of the air may be introduced/discharged through the suction port 130 the discharge port 170, but most of the air circulates internally.

When the circulation damper 150 is closed, driving of the suction fan 165 is stopped to minimize introduction/discharge of external air. The circulation fan 160 may operate to cause internal air circulation. In the case that the internal temperature of the case 110 is within the temperature range allowing the display panel 120 and/or the circuit unit 125 to be driven, the circulation fan 160 may not be driven since the temperature does not need to be controlled by driving the fan 160. That is, the circulation fan 160 may be driven only when the temperature is less than or equal to a fourth reference temperature. The fourth reference temperature may be less than or equal to the first reference temperature.

Figure 4A:
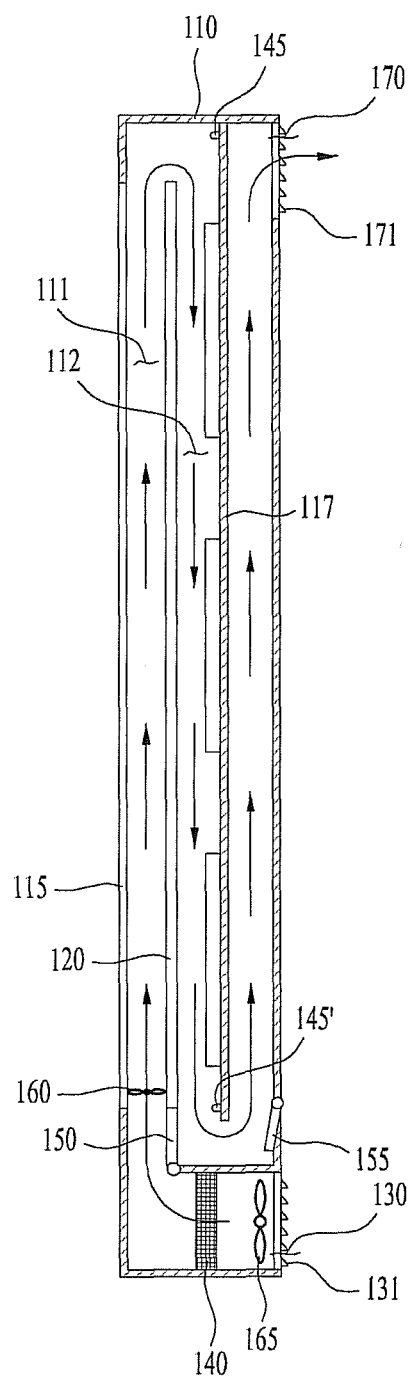
FIGS. 4A and 4B are lateral cross-sectional views of digital sign, according to a second embodiment as broadly described herein.
Figure 4B:
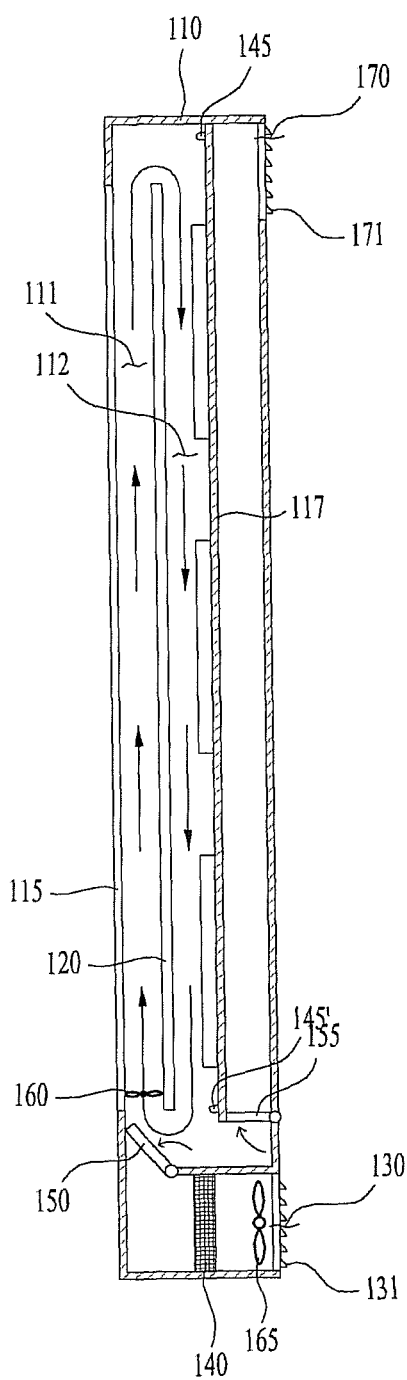

FIGS. 4A and 4B are lateral cross-sectional views of digital sign 100 according to a second embodiment. Unlike the embodiment illustrated in FIGS. 3A and 3B, this embodiment may further include a shield damper 155. As in the previous embodiment, the circulation damper 150 closes one of the introduction port or the discharge port 170, and thus the other one of the introduction port or the discharge port 170 is in an opened state.

To interrupt flow of air introduced/discharged through the introduction port or the discharge port 170 in the opened state and cause the air to circulate in the case 110, the first space 111 and the second space 112 are shielded from the outer side of the case 110 by driving the shield damper 155, as shown in FIG. 4B. The shield damper 155 is closed when the circulation damper 150 is opened, and is opened when the circulation damper 150 is closed. That is, the shield damper 155 is opened when the temperature is greater than or equal to the first reference temperature, and is closed when the temperature is less than the first reference temperature.

In this embodiment, two or more temperature sensors 145 and 145' may be provided in the case 110. In the case that two or more temperature sensors 145 and 145' are provided in the case 110, a temperature difference may be measured. In the case that one end of the interior of the case 110 is excessively cold or hot, it may be determined that the temperature difference in the case 110 needs to be reduced by circulating the internal air, and the circulation fan 160 may be driven. That is, when the difference between the values measured the two or more temperature sensors 145 and 145' is greater than or equal to a fifth reference temperature, the circulation fan 160 may be driven.

Figure 5A:
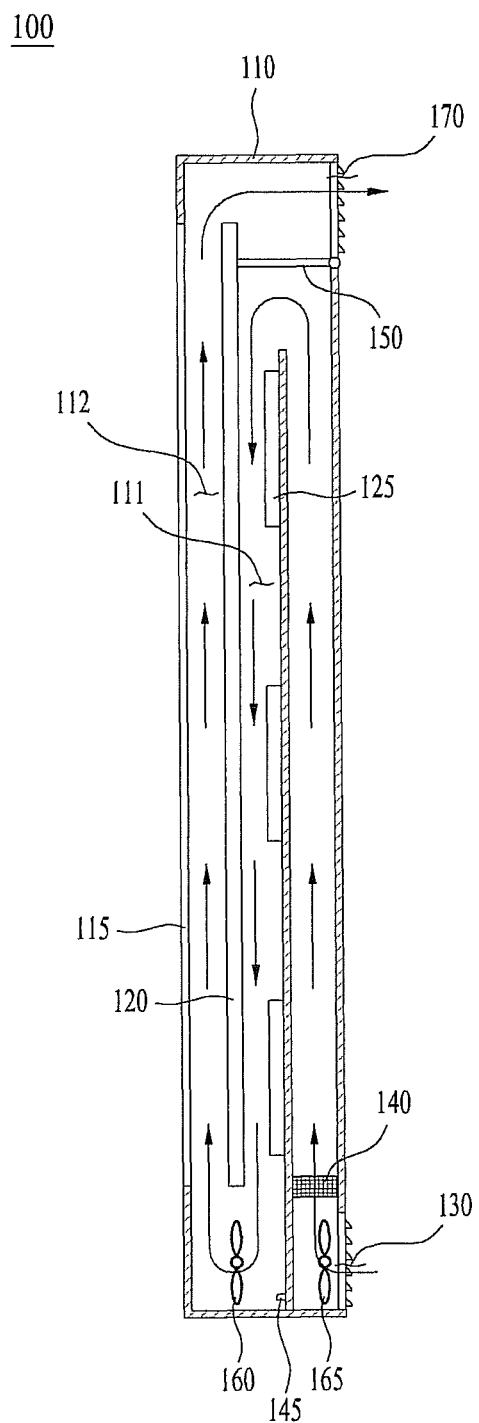
FIGS. 5A and 5B are lateral cross-sectional views of digital sign, according to a third embodiment as broadly described herein.
Figure 5B:
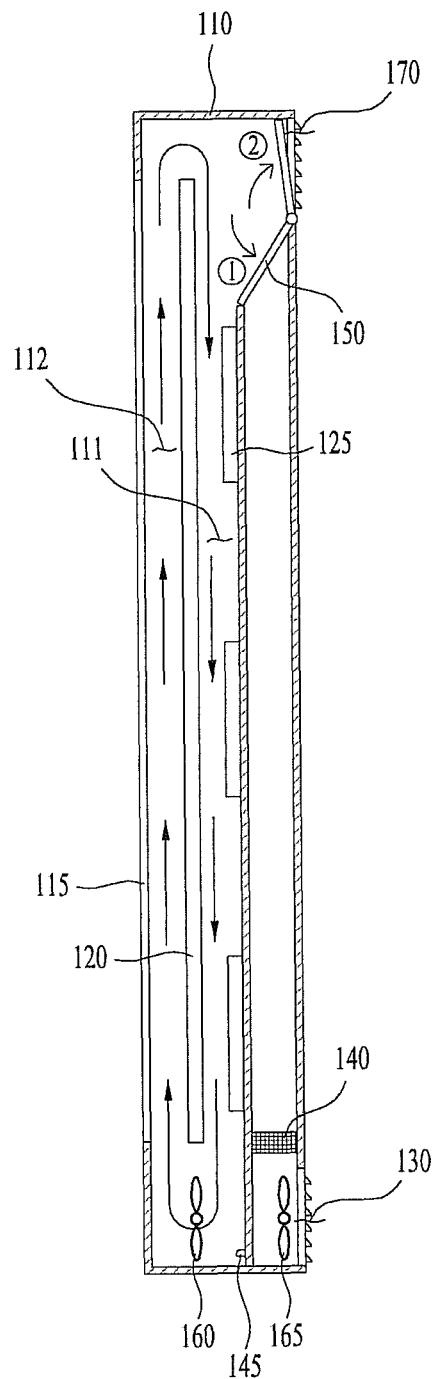

FIGS. 5A and 5B are lateral cross-sectional views of digital sign 100 according to a third embodiment. In this embodiment, the first space 111 is at the rear side of the display panel 120 and is provided with the circuit unit 125. The second space 112 is arranged between the display panel 120 and the glass 115. In this embodiment, the first space 111 and the second space 112 are divided by the display panel 120. The spaces are open at the lower end of the display panel 120 and are closed at the upper end of the display panel 120 by the circulation damper 150.

In the embodiment of FIGS. 5A and 5B, the positions of the first space 111, the second space 112, and the circulation damper 150 are different than in the previous embodiment, but the flow of air introduced into the suction port 130 is similar to the flow in the previous embodiment in that the air flows from the first space 111 to the second space 112 and then leaves the case through the discharge port 170.

FIG. 5A illustrates circulation of air in a high-temperature environment, in which the circulation damper 150 is closed. FIG. 5B illustrates circulation of air in a low-temperature environment, in which the circulation damper 150 is opened. The circulation damper 150 may be moved to position ① to shield the suction port 130, and may be moved to position ② to shield the discharge port 170. In either case, the second ends of the first space 111 and the second space 112 are open, and thus a loop of air circulation is formed in the case 110.

Figure 6A:
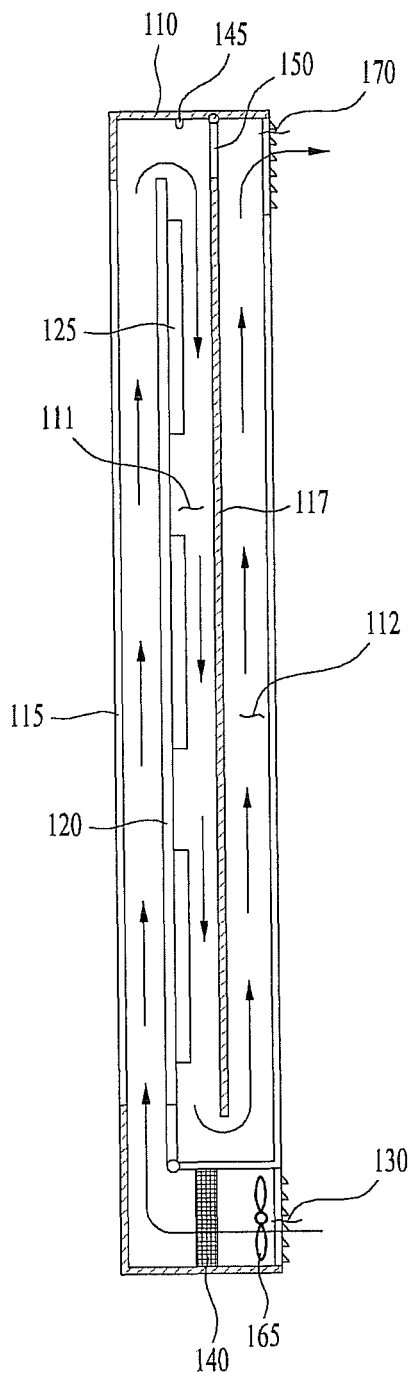
FIGS. 6A and 6B are lateral cross-sectional views of digital sign, according to a fourth embodiment as broadly described herein.
Figure 6B:
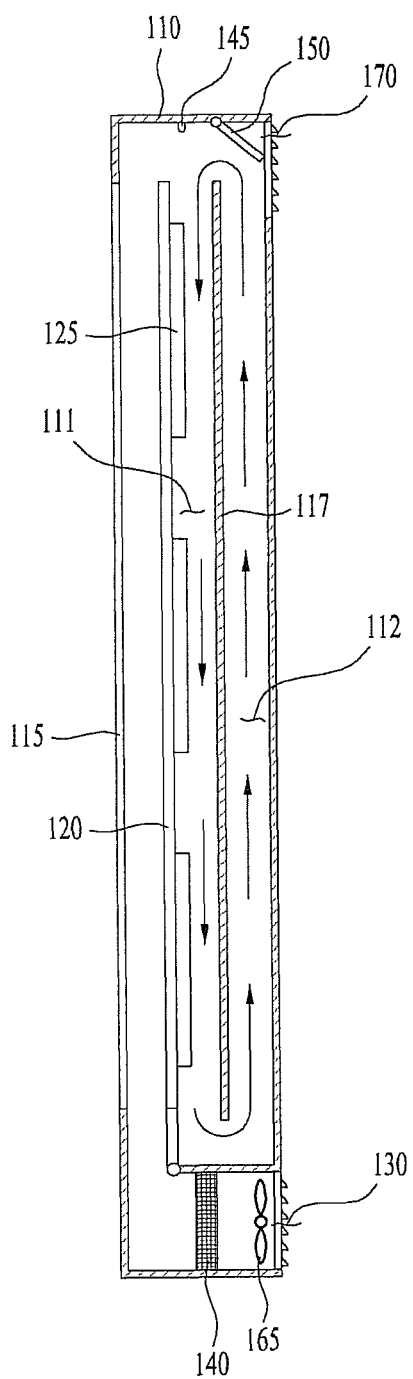

FIGS. 6A and 6B are lateral cross-sectional views of digital sign 100 according to a fourth embodiment. In this embodiment, the first space 111 and the second space 112 are divided by a partition 117 positioned behind the display panel 120. One end of the partition 117 (the lower end in the figures) is open, and the end side (the upper end in the figures) is opened and closed by the circulation damper 150.

In a high-temperature environment shown in FIG. 6A, the circulation damper 150 is closed, and the suction fan 165 is driven to draw in the external air. The air is introduced into the space between the glass 115 and the display panel 120, passing through the first space 111 and the second space 112 and leaving through the discharge port 170. In a low-temperature environment shown in FIG. 6B, the circulation damper 150 is opened, and the first space 111 and the second space 112 forms a circulation loop, causing air to circulate in the case 110.

Figure 7A:
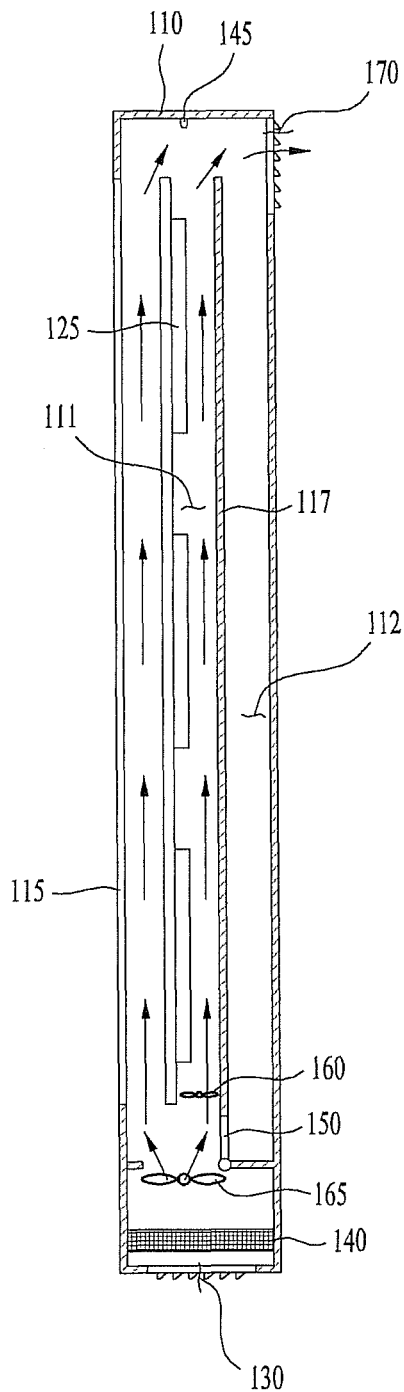
FIGS. 7A and 7B are lateral cross-sectional views of digital sign, according to a fifth embodiment as broadly described herein.
Figure 7B:
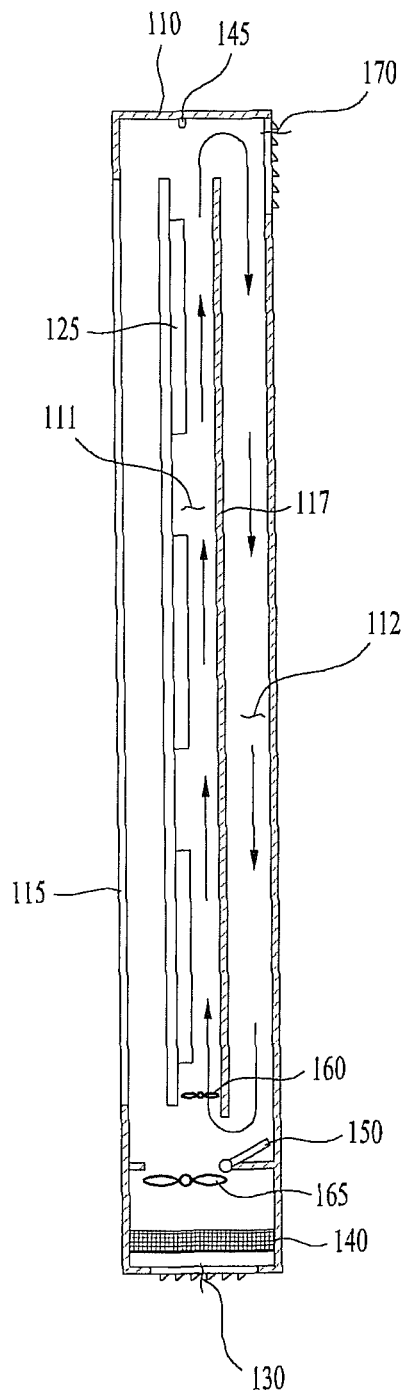

FIGS. 7A and 7B are lateral cross-sectional views of digital sign according to a fifth embodiment. Similar to the embodiment of FIGS. 6A and 6B, the first space 111 and the second space 112 according to this embodiment is divided by the partition 117.

Unlike the previous embodiment, external air simultaneously flows along the front surface and rear surface of the display panel 120. After reaching the upper portion, the air leaves through the discharge port 170. In this embodiment, the suction fan 165 is located at the inner side of the filter 140. Thereby, contamination of the suction fan 165 may be prevented.

FIG. 7B illustrates driving of the digital sign in a low-temperature environment. When the circulation damper 150 is opened, the first space 111 and the second space 112 divided by the partition 117 are connected to each other so that a circulation loop is formed.

As described in the previous embodiments, the first space 111 and the second space 112 may be divided by the display panel 120 or the partition 117, and a circulation loop formed by opening or closing the circulation damper 150 allows circulation of air without introduction of external air or discharge of internal air. When the second ends of the first space 111 and the second space 112 are shielded, external air is introduced, and thus the internal temperature of the case 110 may be maintained at a driving temperature for the display panel 120 and the circuit unit 125.

Even in a low-temperature environment, heat is generated when the display panel 120 and the circuit unit 125 are driven, and this heat may be utilized and not wasted. Accordingly, a separate heater is not necessary, improving energy efficiency. In addition, since the digital sign may be driven with a constant temperature maintained in a high-temperature environment, it may be installed in a place where the temperature difference is relatively large between seasons.

Hereinafter, a method of driving the digital sign 100 described above will be described with reference to FIGS. 8 and 9.

Figure 8:
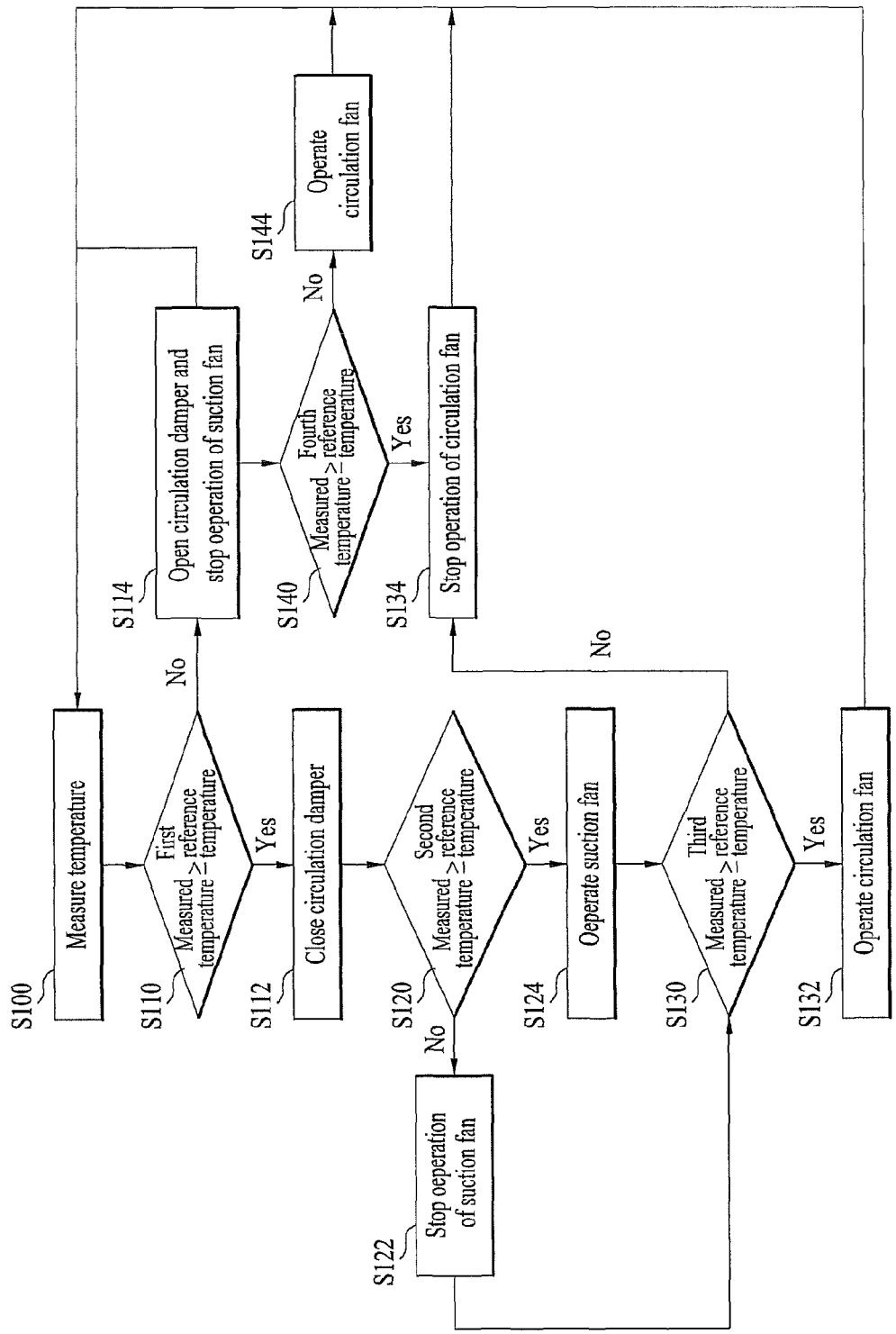
FIG. 8 is a flowchart of a method of driving digital sign, according to an embodiment as broadly described herein.

Referring to FIG. 8, the temperature sensor 145 measures the external temperature or internal temperature of the case 110 (S100). Then, it is determined whether the measured temperature is greater than or equal to the first reference temperature (S110). If the measured temperature is greater than or equal to the first reference temperature, the circulation damper 150 is closed (S112) to shield the second ends of the first space 111 and the second space 112. If the measured temperature is less than the first reference temperature, the circulation damper 150 is opened (S114) to form a circulation loop. When the circulation damper 150 is opened (S114), operation of the suction fan 165 is stopped to minimize introduction of external air and allow circulation of air in the case 110.

The first reference temperature represents a temperature at which it is determined that external air needs to be introduced to perform a cooling operation in response to an increase in the internal temperature of the case 110. For example, the circulation damper 150 may be opened before the temperature exceeds the allowable operating temperature range (from about 0° C. to about 50° C.). For example, the first reference temperature may be set to about 40° C.

In the case that the circulation damper 150 is closed, which represents a high-temperature environment, the measured temperature is compared with the second reference temperature (S120). If the measured temperature is greater than or equal to the second reference temperature, the suction fan 165 is operated (S124). If the measured temperature is less than the second reference temperature, operation of the suction fan 165 is stopped (S122). The second reference temperature may be greater than or equal to the first reference temperature. In the case that the second reference temperature is equal to the first reference temperature, closing the circulation damper 150 and operating the circulation damper 150 may be performed simultaneously.

The circulation fan 160 may be operated when the temperature is greater than or equal to the third reference temperature (S130 and S132). The third reference temperature may be greater or less than the second reference temperature. At the higher one of the two reference temperatures, the circulation fan 160 and the suction fan 165 are both driven. At a temperature between the second reference temperature and the third reference temperature, only one of the circulation fan 160 and the suction fan 165 is driven. In the case that the temperature is high and thus cooling efficiency needs to be increased, both fans 160 and 165 may be driven. In other cases, only one of the fans 160 and 165 may be driven to save energy.

In the case that the circulation damper 150 is opened and operation of the suction fan 165 is stopped (S114), the measured temperature is compared with the fourth reference temperature (S140), and whether to operate the circulation fan 160 is determined (S144 and S134).

In the case that the measured temperature is less than the fourth reference temperature, the temperature is prevented from decreasing below the allowable operating temperature range of the display panel 120 and the circuit unit 125 by driving the circulation fan 160 to absorb heat from the circuit unit 125 and the display panel 120 and maintain the internal temperature of the case 110 within the temperature range.

The circulation fan 160 may be continuously driven without comparing the internal temperature of the case 110 with the third reference temperature or the fourth reference temperature to maintain a uniform temperature. In this case, steps S130 and S140 may be omitted.

Figure 9:
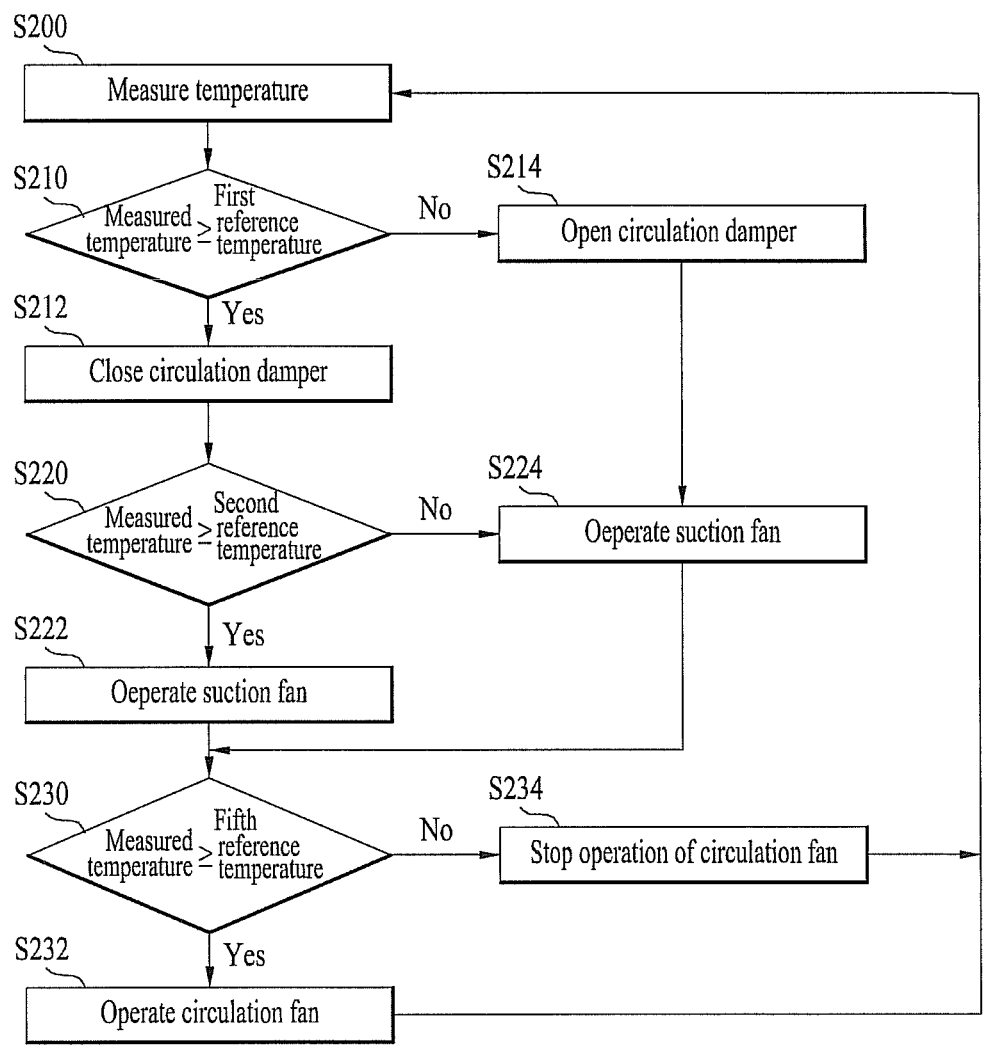
FIG. 9 is a flowchart of a method of driving digital sign, according to another embodiment as broadly described herein.

FIG. 9 is a flowchart illustrating a method of driving the digital sign according to another embodiment. The steps S200, S210, S212, S214, S220, S222 and S224 shown in FIG. 9 are the same as the steps S100, S110, S112, S114, S120, S122 and S124 shown in FIG. 8, and thus a detailed description thereof will be omitted.

However, unlike the previous embodiment, in the embodiment shown in FIG. 9, regarding operation of the circulation fan 160, the internal temperatures of the case 110 may be measured using two or more temperature sensors 145. In the case that the temperature difference is greater than or equal to the fifth reference temperature (S230), the circulation fan 160 is operated (S232). The circulation fan 160 is driven to maintain a uniform temperature of the case 110. Accordingly, in the case that the difference between the internal temperatures of the case 110 is relatively small, the circulation fan 160 does not need to be operated (S234).

As described above, according to at least one embodiment, the display panel 120 and the circuit unit 125 in the digital sign 100 may be maintained within an allowable operating temperature range, and therefore the digital sign 100 may be installed even in a low-temperature environment.

Since there is no need to install a heater in the digital sign, the number of components may be reduced, and energy consumed when a heater is driven may be saved. In addition, operation of the suction fan may be stopped in a low-temperature environment, thereby reducing energy consumption.

In addition, during circulation of the internal air, the air is not introduced through the filter, and thus the service life of the filter may be elongated.

According to at least one embodiment, the display panel and the circuit unit in the digital sign may be maintained within an operation-allowing temperature range thereof, and therefore the digital sign may be installed even in a low-temperature environment.

Since there is no need to install a heater in the digital sign, the number of components may be reduced, and energy consumed when a heater is driven may be saved. In addition, operation of the suction fan may be stopped in a low-temperature environment, and thereby energy consumption may be reduced.

In addition, during circulation of the internal air, the air is not introduced through the filter, and thus the service life of the filter may be elongated Digital sign is provided which may stably operate even in a low temperature environment.

Digital sign, as embodied and broadly described herein, may include a display panel, a circuit unit configured to drive the display panel, a case provided therein with the display panel, the circuit unit, and an inner space including a first space, and a second space, wherein one side of the first space is connected to one side of the second space, a suction port formed in the case to allow external air to be introduced into the inner space therethrough, a discharge port formed in the case to allow the introduced air to be discharged therethrough, a circulation fan disposed in the inner space to induce flow of air in the inner space, and a circulation damper disposed between the other side of the first space and the other side of the second space to open and close the other sides, wherein the air introduced through the suction port passes through the inner space of the case and is discharged through the discharge port when the circulation damper is closed, and the air circulates in the first space and the second space when the circulation damper is opened.

The digital sign may also include at least one temperature sensor to measure a temperature of an interior or exterior of the case, wherein the circulation damper may be configured to be closed when the temperature measured by the temperature sensor is greater than or equal to a first reference temperature, and be opened when the temperature measured by the temperature sensor is less than to the first reference temperature.

The temperature sensor may be a bimetal having a shape changing according to the temperature, wherein the bimetal may be configured to be deformed to generate a signal to close the circulation damper when the temperature is greater than equal to the first reference temperature and to be deformed to generate a signal to open the circulation damper when the temperature is less than the first reference temperature.

The digital sign may also include a suction fan positioned inside the suction port to cause the external air to be introduced, wherein the suction fan may be configured to operate when the measured temperature is greater than or equal to a second reference temperature and to stop operating when the measured temperature is less than the second reference temperature.

The circulation fan may be configured to operate when the temperature measured by the temperature sensor is greater than or equal to a third reference temperature or less than a fourth reference temperature and to stop operating when the temperature is less than the third reference temperature or greater than or equal to the fourth reference temperature.

A plurality of temperature sensors of the at least one temperature sensor may be provided in the case, the temperature sensors being spaced apart from each other, wherein the circulation fan may operate when a difference between temperatures measured by the plurality of temperature sensors is greater than or equal to a fifth reference temperature.

The digital sign may also include a suction fan positioned inside the suction port and configured to operate and allow introduction of the external air only when the circulation damper is closed.

The digital sign may also include glass provided to a front surface of the case, wherein the first space may be formed between the glass and a display part arranged apart from the glass.

The second space may be arranged at a rear side of the display, and the circuit unit may be positioned in the second space.

When the circulation damper is opened, the circulation damper may interrupt connection of the first space and the second space to at least one of the suction port and the discharge port.

The digital sign may also include a shield damper to open or close connection of the first space and the second space to at least one of the discharge port and the suction port, wherein the shield damper may be closed when the circulation damper is opened.

The digital sign may also include a partition to divide the first space and the second space, wherein the circulation damper may open and close an upper portion or lower portion of the partition.

The display panel and the circuit unit may be positioned in the first space.

The digital sign may also include a filter positioned inside the suction port.

The filter may be formed of Gore-tex.

The suction port may be positioned at a lower portion of the case, and the discharge port may be positioned at an upper portion of the case.

The digital sign may also include a louver formed at an upper portion of the suction port or the discharge port.

A method of driving digital sign including a first space and a second space, one side of the first space being connected to one side of the second space, as embodied and broadly described herein, may include the steps of measuring a temperature of an interior or exterior of the digital sign, closing a circulation damper configured to open and close the other side of the first space and the second space when the temperature measured by the temperature sensor is greater than or equal to a first reference temperature, opening the circulation damper when the measured temperature is less than the first reference temperature, driving a suction fan to introduce air into the first space and the second space when the measured temperature is greater than or equal to a second reference temperature, and stopping driving of the suction fan when the measured temperature is less than the second reference temperature.

The method may also include the steps of operating a circulation fan provided to the first space or the second space when the measured temperature is greater than or equal to a third reference temperature or less than the fourth reference temperature, and stopping operation of the circulation fan when the measured temperature is greater than or equal to the third reference temperature and less than a fourth reference temperature.

In the measuring step, the temperature may be measured at spaced positions in the digital, and the circulation fan may be operate when a difference between the measured temperatures is greater than or equal to a fifth reference temperature.

According to at least one embodiment as broadly described herein, the display panel and the circuit unit in the digital sign may be maintained within an operation-allowing temperature range thereof, and therefore the digital sign may be installed even in a low-temperature environment.

Since there is no need to install a heater in the digital sign, a number of components may be reduced, and energy consumed when a heater is driven may be saved. In addition, operation of a suction fan may be stopped in a low-temperature environment, and thereby energy consumption may be reduced.

In addition, during circulation of internal air, the air is not conveyed through a filter, and thus a service life of the filter may be elongated.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A digital sign, comprising:
   a case having an inner space, the inner space including a first space in communication with a second space at respective first ends thereof;
   a display panel provided in the case;
   a circuit device to drive the display panel;
   a suction port formed in the case to guide external air into the inner space;
   a discharge port formed in the case to allow discharge air from the case;
   a circulation fan provided in the inner space to induce air flow in the inner space;
   a circulation damper provided between respective second ends of the first space and the second space to selectively open and close the respective second ends of the first and second spaces, and
   at least one temperature sensor to measure at least one of a temperature of the inner space of the case or a temperature of an exterior of the case,
   wherein the air introduced into the inner space of the case through the suction port passes through the inner space of the case and is discharged through the discharge port when the circulation damper is in a closed position, and the air circulates in the first space and the second space when the circulation damper is in an open position, and
   wherein the circulation damper is in the closed position when the temperature measured by the temperature sensor is greater than or equal to a first reference temperature; and is in the open position when the temperature measured by the temperature sensor is less than the first reference temperature.

2. The digital sign of claim 1, wherein the at least one temperature sensor comprises a bimetal temperature sensor having a shape that changes based on a sensed temperature,
   wherein the bimetal deforms when the sensed temperature is greater than or equal to the first reference temperature and generate a corresponding signal to close the circulation damper, and to deform when the sensed temperature is less than the first reference temperature and generate a corresponding signal to open the circulation damper.

3. The digital sign of claim 1, further comprising a suction fan provided in the inner space, at a position corresponding to the suction port, to draw external air into the case, wherein the suction fan operates when the sensed temperature is greater than or equal to a second reference temperature, and to stop operating when the sensed temperature is less than the second reference temperature.

4. The digital sign of claim 3, wherein the circulation fan operates when the temperature sensed by the at least one temperature sensor is greater than or equal to a third reference temperature or less than a fourth reference temperature, and to stop operating when the sensed temperature is less than the third reference temperature or greater than or equal to the fourth reference temperature.

5. The digital sign of claim 4, wherein the at least one temperature sensor comprises a plurality of temperature sensors provided in the case, the plurality of temperature sensors being spaced apart from each other,
   wherein the circulation fan operates when a difference between temperatures sensed by two of the plurality of temperature sensors is greater than or equal to a fifth reference temperature.

6. The digital sign of claim 5, wherein the first reference temperature is within an allowable operating temperature range of at least one of the display panel or the circuit device.

7. The digital sign of claim 1, further comprising a suction fan provided in the inner space, at a position corresponding to the suction port, and drawing external air into the inner space of the case only when the circulation damper is in the closed position.

8. The digital sign of claim 1, further comprising a glass panel provided at a front surface of the case, wherein the first space is formed between the glass panel and the display panel arranged in the inner space of the case, spaced apart from the glass panel.

9. The digital sign of claim 8, wherein the second space is formed at a rear side of the display, and the circuit device is provided in the second space.

10. The digital sign of claim 8, wherein, when the circulation damper is in the open position, the circulation damper blocks a connection of the first space and the second space to at least one of the suction port or the discharge port.

11. The digital sign of claim 1, further comprising a shield damper selectively opening and closing a connection of the first space and the second space to at least one of the discharge port or the suction port, wherein the shield damper is in a closed position when the circulation damper is in the open position.

12. The digital sign of claim 1, further comprising a partition provided in the case to partition the first space and the second space, wherein the circulation damper is provided at an upper end or a lower end of the partition to selectively open and close a space above or below the partition, respectively.

13. The digital sign of claim 12, wherein the display panel and the circuit device are positioned in the first space.

14. The digital sign of claim 1, further comprising a filter positioned at an inside of the suction port, wherein the filter is formed of a water repellent material.

15. The digital sign of claim 1, wherein the suction port is provided at a lower portion of the case, and the discharge port is provided at an upper portion of the case.

16. The digital sign of claim 1, further comprising a louver formed at an upper portion of at least one of the suction port or the discharge port.

17. A method of driving a digital sign, the digital sign including an inner space forming a first space in communication with a second space via a first end of the first space and a first end of the second space, the method comprising:

sensing a temperature of an interior or exterior of the digital sign;

closing a circulation damper provided at respective second ends of the first space and the second space when the temperature sensed by the temperature sensor is greater than or equal to a first reference temperature, and opening the circulation damper when the sensed temperature is less than the first reference temperature;

driving a suction fan to draw external air into the first space and the second space when the sensed temperature is greater than or equal to a second reference temperature; and stopping driving of the suction fan when the sensed temperature is less than the second reference temperature.

18. The method of claim 17, further comprising:

operating a circulation fan provided in the first space or the second space when the sensed temperature is greater than or equal to a third reference temperature or less than a fourth reference temperature; and stopping operation of the circulation fan when the sensed temperature is greater than or equal to the third reference temperature and less than the fourth reference temperature.

19. The method of claim 18, wherein sensing a temperature of an interior or exterior of the digital sign comprises sensing the temperature at a plurality of spaced positions, and wherein the method further comprises operating a circulation fan provided in the first space or the second space when a difference between two of the sensed temperatures is greater than or equal to a fifth reference temperature.

* * * * *